(12) United States Patent
Alexander et al.

(10) Patent No.: US 7,193,487 B2
(45) Date of Patent: Mar. 20, 2007

(54) MULTILAYER BOARD SWITCH MATRIX

(75) Inventors: Jay Alexander, Danville, NH (US);
Anthony Cappello, Bedford, NH (US);
Raymond Kaarsberg, Westford, MA (US); Robert Patukonis, Merrimack, NH (US)

(73) Assignee: M/A-Com, Inc., Lowell, MA (US)

( * ) Notice: Subject to any disclaimer, the term of this patent is extended or adjusted under 35 U.S.C. 154(b) by 25 days.

(21) Appl. No.: 11/020,341

(22) Filed: Dec. 23, 2004

(65) Prior Publication Data
US 2006/0139119 A1    Jun. 29, 2006

(51) Int. Cl.
*H01P 1/10* (2006.01)
*H03H 7/38* (2006.01)

(52) U.S. Cl. .................................. 333/104; 333/32
(58) Field of Classification Search ............... 333/101, 333/103, 104, 116, 32
See application file for complete search history.

(56) References Cited

U.S. PATENT DOCUMENTS

| 6,208,219 B1 * | 3/2001 | Singer | 333/104 |
| 6,393,309 B1 * | 5/2002 | Mansour | 505/210 |
| 6,965,279 B2 * | 11/2005 | Carson | 333/116 |

* cited by examiner

Primary Examiner—Dean Takaoka

(57) ABSTRACT

A multi-layer cross connect having high isolation between signal channels, the multi-layer cross connect comprising: (a) a multi-layer circuit board having a top and bottom orientation and comprising at least a bottom layer and one or more upper layers; (b) a plurality of microstrip launches along the perimeter of the bottom layer; (c) a plurality of striplines on the bottom layer, each stripline being connected to one and only one microstrip launch and comprising a transformer for lowering its impedance and thereby increasing its width, the striplines comprising first striplines and second striplines; (d) a plurality of transition vias, each transition via conductively coupling each of the second striplines to a stripline on an upper layer; and (e) a combiner on each layer for combining signals from multiple striplines to a common stripline.

20 Claims, 10 Drawing Sheets

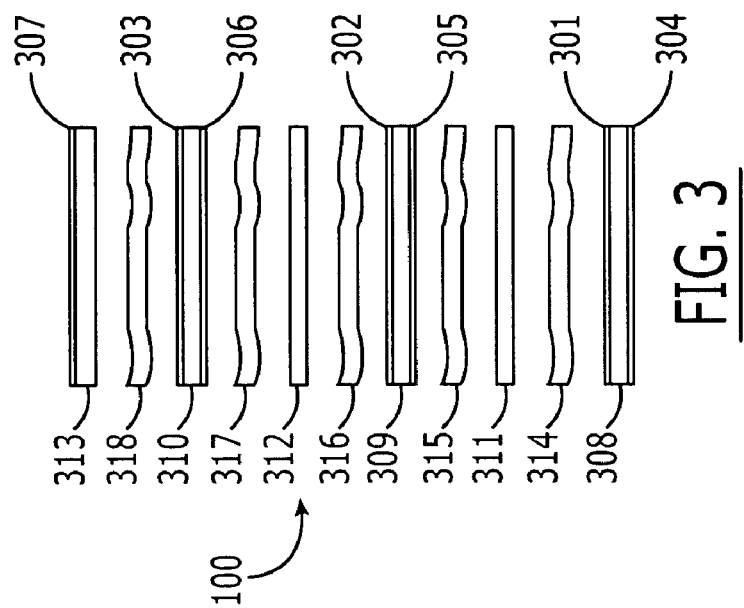
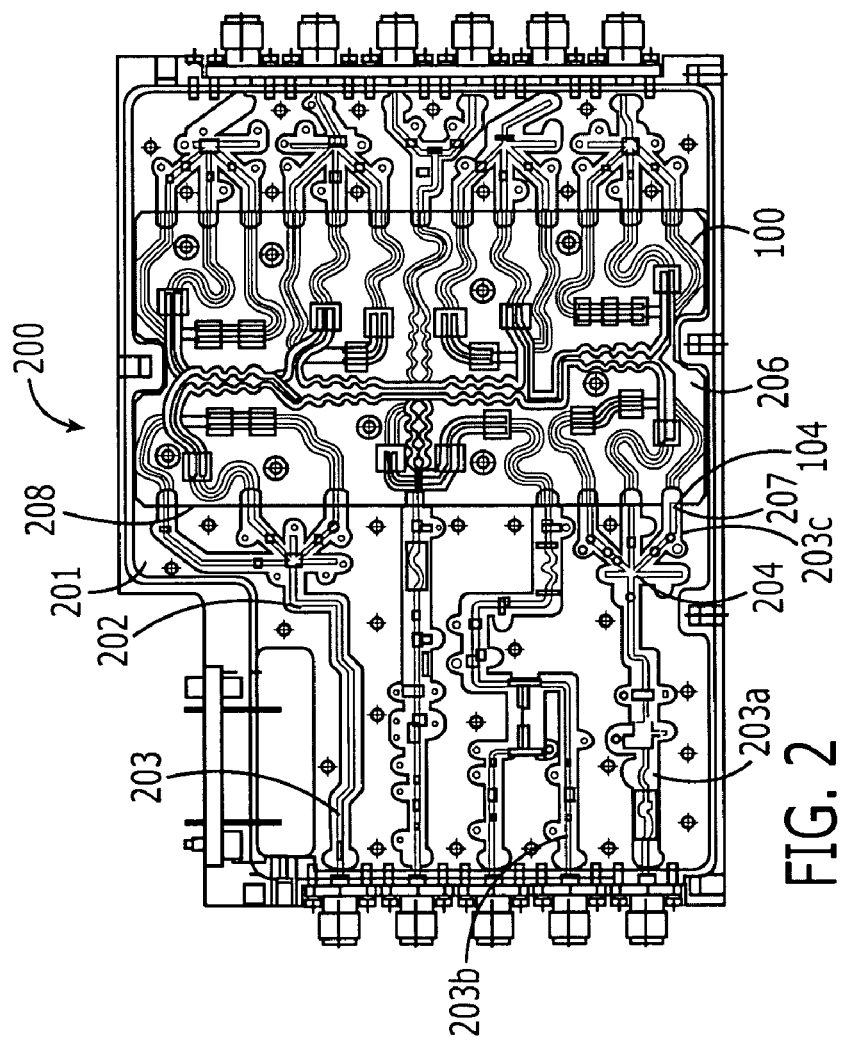

MULTILAYER BOARD SWITCH MATRIX

FIELD OF INVENTION

The present invention relates generally to a high frequency signal switch matrix, and, more particularly, to a compact switch matrix using a multi-layer board cross connect with high isolation.

BACKGROUND

Switch matrixes are ubiquitous in signal transmission systems. Generally, switch matrixes serve to direct one of various inputs to a desired output. Of particular interest herein are switch matrixes used in high frequency applications such as those involving microwave and other radio frequency (RF) signals (collectively referred to herein as "RF signal applications"). Examples of RF signal applications using switch matrixes include, for example, instrumentation such as radar, and telecommunications such as cell phones.

An essential component of a signal switch matrix is a cross connect (or combiner) which serves to couple each of the inputs with each of the outputs. These are generally passive devices employing "combiners" to combine signals from "n" number of input conductors on to "m" number of output conductors, resulting in an n×m switch matrix. This way, a signal on each and every input conductor is coupled to each and every output conductor. Examples of cross connects include n×m perfect shuffles in which n=m, or asymmetrical cross connects in which n≠m, with typically n>m. As used herein, the term "cross connect" refers collectively to cross connects, combiners, and splitters having the configuration described above.

In the electronics field, the need to decrease costs and increase performance creates a constant need and desire to miniaturize. There is particular pressure to reduce the "foot print" of switch matrixes to facilitate their installation in densely-packed electronic devices such as aircraft radar systems, hand-held cellular phones, and other miniature communication devices. A promising solution to reduce the foot print is the use of multilayer circuit boards in these devices. Multilayer circuit boards have become popular recently as a way of concentrating electronics and freeing critical surface area for other components. Basically, a multi-layer circuit board comprises a number of circuit boards in which each circuit board comprises circuitry interconnected by transition vias running perpendicularly through the boards.

Although multi-layer circuit boards provide an attractive solution for minimizing the foot print of signal switch matrixes, they tend to lack sufficient isolation between channels. Isolation within the switch matrix is critical to ensure that signals on one channel are not corrupted by those on another. Isolation becomes more difficult as the frequency of the signals increases. For example, isolation is particularly difficult at the operating frequencies contemplated in this application—that is, in 20 GHz range. The difficulty in isolating high frequency signals is exasperated by the miniaturization of these components. As mentioned above, there is significant pressure to reduce the size of switching circuits. This reduction in size necessarily requires that the channels be more densely packed which makes them more susceptible to interference. Further exasperating the problem is the fact that most of the channels in a switch matrix tend to be amplified, and, therefore, any errant RF mode induced on the channels will be amplified.

Therefore, there is a need for a switch matrix system that is compact but maintains good isolation between the signal channels. The present invention fulfills this need among others.

SUMMARY OF INVENTION

The present invention provides for a compact, multi-layer cross connect and switch matrix design with exceptionally good isolation. Specifically, the multi-layer cross connect and switch matrix design improves isolation between layers and between channels by combining certain geometrical relationships and shielding features.

The applicants recognize that by establishing certain size and shape relationships in the switch matrix and multi-layer cross connect, the emanation and propagation of errant RF modes can be reduced or even eliminated. For example, one such geometrical feature is the widening of the conductors or "striplines" in the multi-layer cross connect. Increasing the width of the striplines has a number of benefits. First, by increasing the width of the striplines relative to their height, the detrimental effect of "fringing capacitance" is reduced. Fringing capacitance is responsible mainly for the capacitive coupling between striplines. The negative effects of fringing capacitance become more pronounced as the proportion of "parallel plate capacitance" to fringing capacitance drops. In the stripline configuration of the present invention, it has been found that fringing capacitance depends in part on the height of the stripline, while parallel plate capacitance depends largely on the width of the stripline. Thus, by increasing the width of the striplines relative to the height, the detrimental effects of fringing capacitance can be mitigated.

Second, in addition to improving isolation by increasing the proportion of parallel plate capacitance to fringing capacitance, wider striplines facilitate the use of larger diameter transition vias. It has been found that wider transition vias are less inductive, especially if the diameter of the transition via exceeds its height. Further, since both the striplines and transition vias are wider, have lower impedance, and contain more conductive material, they are more efficient conductors, which improves the overall performance of the device aside from improving isolation.

Another geometrical feature which improves performance is the spacing of transition vias to phase cancel reflective losses. To transmit a signal from a bottom layer of the multi-layer cross connect to a third or higher layer, a series of transition vias are used, one between each layer. It has been found that spacing these transition vias apart by an interval of a ¼ wavelength of the expected operating frequency results in the phase cancellation of reflected signals and, hence, improved reflective loss. In fact, it has been observed that due to this phase cancellation, reflective loss on the third layer is better than that on the second layer which only comprises one transition via.

Still another geometrical relationship that improves isolation is a ground gap at the interface of the conductors or "microstrip launch" of the multi-layer cross connect and the conductors or "microstrip" of the switch matrix in which the multi-layer cross connect is incorporated. Although a continuous connection between the microstrip and microstrip launch would restrict, most effectively, errant RF modes, mechanical tolerances between the multi-layer cross connect and switch matrix housing in the form of a gap are required to facilitate the installation of the multi-layer cross connect in the switch matrix housing. It has been found though, that by limiting this gap to a small fraction of the wavelength of the highest operating frequency of the switch matrix, errant RF modes are attenuated, just as small holes in the metal door of a microwave oven prevent microwave radiation from escaping.

Yet another geometrical relationship of the multi-layer cross connect, which contributes to high isolation, is the layout of the striplines. Specifically, the striplines are curved such that adjacent striplines are not parallel and are constantly vary in separation along their length. Curving lines minimize inductive coupling to adjacent lines because they are relatively close together for only short distances.

In addition to preventing the formation and propagation of errant RF modes by exploiting geometric relationships, the switch matrix of the present invention preferably comprises one or more shielding structures to block emissions and therefore improve isolation. A preferred shielding feature is the presence of isolation vias disposed around the conductors of the multi-layer cross connect. For example, isolation vias disposed between striplines and around transition vias within the multi-layer cross connect disrupt the coupling of errant RF modes to adjacent striplines.

Another shielding feature of the multi-layer cross connect is ground layers interleaved between each circuit of the multilayer circuit board of the multi-layer cross connect. The ground plane layers prevent the transmission of errant RF modes between layers. Further, it has been found that if the distance between the ground layers is sufficiently small, RF modes cannot form within the layer. Thus, the ground layers improve layer-to-layer isolation by shielding between stripline layers and suppressing errant RF modes.

Yet another shielding structure is a conductive gasket atop the multi-layer cross connect in the switch matrix. This gasket serves to block errant RF modes from propagating up and around the multi-layer cross connect and coupling with conductors on the other side of the multi-layer cross connect. Preferably, the gasket is sized to be compressed in all areas, but not overly compressed in any. This sizing is accomplished by use of tailored shims. By controlling the compression of the gasket, the gasket is far more effective and the isolation of the switch matrix is enhanced considerably.

By combining one or more of these geometrical and shielding features, a switch matrix is provided having excellent isolation. Accordingly, one aspect of the invention is a switch matrix and multi-layer cross connect in which the number of possible isolated channels is greater than conventional switch matrix designs. In a preferred embodiment, the switch matrix comprises: (a) a housing having a channel floor; (b) a plurality of microstrips on the channel floor; (c) a cavity on the channel floor for receiving the multi-layer cross connect; and (d) a multi-layer cross connect electrically coupled to the microstrips and disposed in the cavity such that it resides on just one side of the channel floor. In a preferred embodiment, the multi-layer cross connect maintains an isolation of at least 80 dB between layers for a non-amplified channel, and the switch matrix maintains an isolation of at least 70 dB between layers for a non-amplified channel.

Another aspect of the invention is a cross connect comprising a multi-layer circuit board having one or more of the geometrical isolation features mentioned above and preferably one or more of the emission blocking features mentioned above. In a preferred embodiment, the multi-layer cross connect comprises: (a) a multi-layer circuit board having a top and bottom orientation and comprising at least a bottom layer and one or more upper layers; (b) a plurality of microstrip launches along the perimeter of the bottom layer; (c) a plurality of striplines on the bottom layer, each stripline being connected to one and only one microstrip launch and comprising a transformer for lowering its impedance and thereby increasing its width, the striplines comprising first striplines and second striplines; (d) a plurality of transition vias, each transition via conductively coupling each of the second striplines to a stripline on an upper layer; and (e) a combiner on each layer for combining signals from multiple striplines to a common stripline.

Another aspect of the invention is a switch matrix comprising the multi-layer cross connect described above. In a preferred embodiment, the switch matrix comprises: (a) a housing having a microstrip channel floor; (b) a plurality of microstrips on the microstrip channel floor, a portion of which are input microstrips and the remaining portion are output microstrips; (c) a switch on each input microstrip; (d) a cavity on the channel floor for receiving the multi-layer cross connect; (e) a ground gap interface on each microstrip adjacent the cavity for interfacing with a microstrip launch of a multi-layer cross connect; (f) a multi-layer cross connect disposed in the a cavity and comprising at least: (i) a multi-layer circuit board having a top and bottom orientation and comprising at least a bottom layer and one or more upper layers; (ii) a plurality of first microstrip launches along the perimeter of the bottom layer, each microstrip launch interfacing with the interface of each microstrip; (iii) a plurality of striplines on the bottom layer, each stripline being connected to one and only one first microstrip launch and comprising a transformer for lowering its impedance and thereby increasing its width relative to the width of the microstrip launch, the striplines comprising first striplines and second striplines; (iv) a plurality of transition vias, each transition via conductively coupling each of the second striplines to a stripline on an upper layer; and (v) a combiner on each layer for combining for combining signals from multiple striplines to a common stripline. In a preferred embodiment, the switch matrix comprises all of the geometrical relationships and shielding features described above.

BRIEF DESCRIPTION OF DRAWINGS

FIG. 2 show a top view of a preferred embodiment of a switch matrix of the present invention incorporating the multi-layer cross connect shown in FIG. 1;

FIG. 3 shows a detailed exploded view of the layered components of the multilayer board of FIG. 1;

DETAILED DESCRIPTION OF PREFERRED EMBODIMENT

Figure 1:
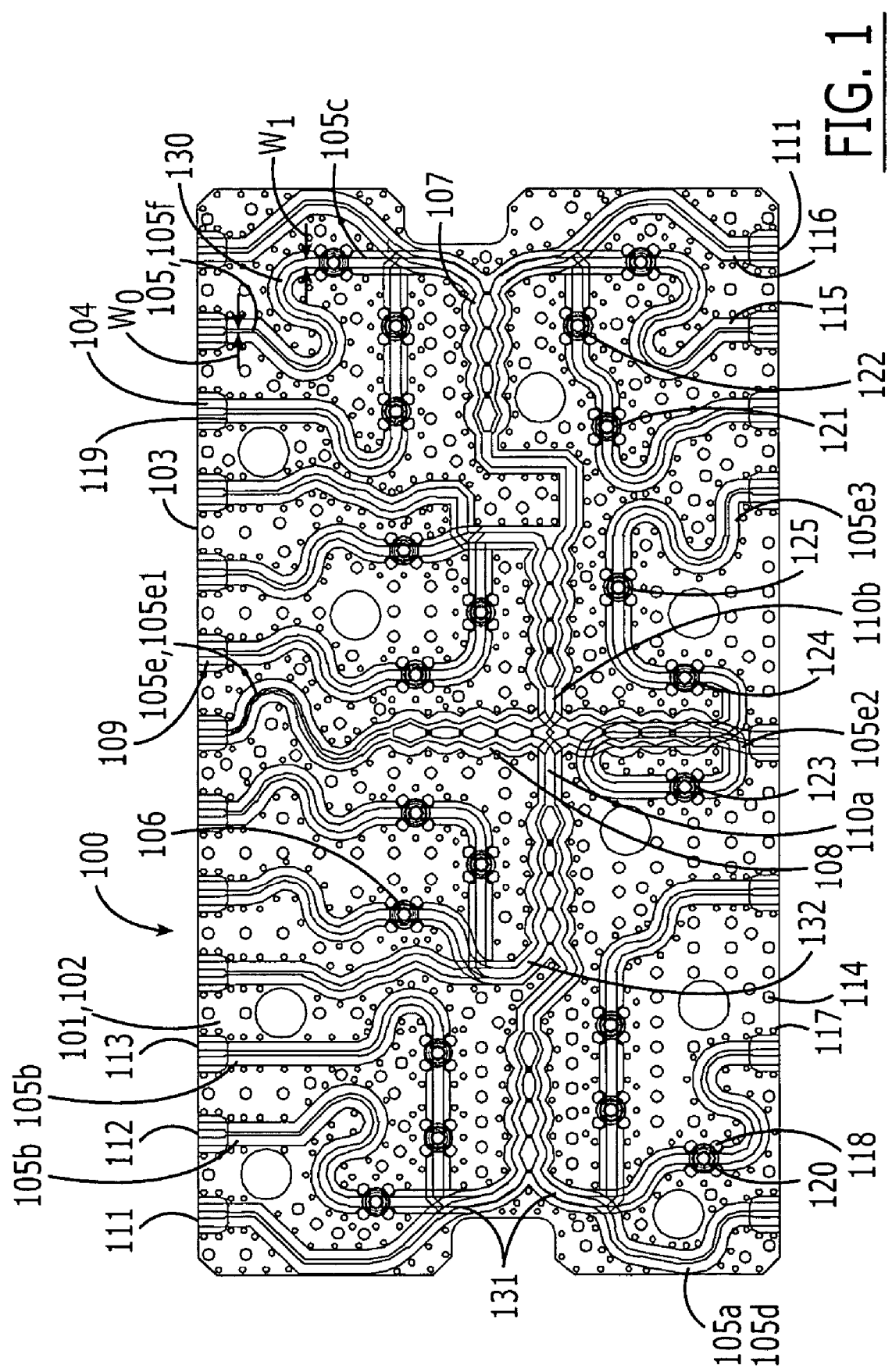
FIG. 1 shows a multi-layer cross connect in which the features of the bottom layer are shown in solid line while those of the upper layers are shown in phantom line.

Referring to FIG. 1, a preferred embodiment of the multi-layer cross connect 100 of the present invention is shown. The multi-layer cross connect 100 comprises a multi-layer circuit board 101 having a top and bottom orientation and comprising at least a bottom layer 102 and one or more upper layers 300 (see FIG. 3). (Note the circuit elements of the upper layers are superimposed on the bottom layer in phantom line.) Along the perimeter 103 of the bottom layer 102, are plurality microstrip launches 104. Each microstrip launch 104 is conductively coupled to one and only one of a plurality of striplines 105 on the bottom layer 101. Each stripline 105 comprises a transformer 130 for lowering its impedance, and thereby increasing its width $w_1$ relative to the width $w_0$ of the stripline 105 adjacent the microstrip launch 104. (As used herein, the term "width," in the context of describing the conductors on the board, refers to the horizontal distance across the conductor normal to the direction of wave propagation in the conductor. Likewise, the term "height," in the context of describing the conductors on the board, refers to the vertical distance across the conductor normal to the direction of wave propagation.) For purposes of description, the striplines are divided into first striplines 105a and second striplines 105b. The multi-layer cross connect 100 also comprises a plurality of transition vias 106. Each transition via 106 is conductively coupled to each of the second striplines 105b to a stripline 105c on an upper layer (shown in phantom line). To combine signals from striplines 105 to one or more common striplines 105e, the multi-layer cross connect 100 comprises one or more combiners 107 on each layer.

Referring to FIG. 2, a preferred embodiment of a switch matrix 200 of the present invention is depicted comprising the multi-layer cross connect 100 shown in FIG. 1. The switch matrix 200 comprises a housing 201 having a channel floor 202. On the floor 202 are a plurality of microstrips 203, a portion of which are input microstrips 203a and the remaining portion are output microstrips 203b. Each input microstrip 203a comprises a switch 204 for directing RF signals on the input microstrip 203a to one of several secondary microstrips 203c. The multi-layer cross connect described above with respect to FIG. 1 is received in a cavity 206 on the channel floor 202. Each microstrip 203 adjacent the cavity 206 comprises a ground gap interface 207 for interfacing with the microstrip launch 104 (see FIG. 1) of the multi-layer cross connect 100. Preferably, all of the microwave circuitry is on the same side of the housing 201. This allows the other side of the housing to be used for microprocessors, digital control circuitry, and power supplies.

The switch and multi-layer cross connect use a combination of geometrical relationships and shielding features to improve isolation. These geometrical and shielding features are described in greater detail below.

Geometrical Features

An important geometrical feature of the multi-layer cross connect of the present invention is its relatively wide striplines. Specifically, by increasing the ratio of the width of the striplines to their height, the detrimental effects of fringing capacitance can be reduced. Fringing capacitance is responsible mainly for the capacitive coupling between adjacent striplines. Fringing capacitance depends in part on the area of the edge of the stripline. (This corresponds to the vertical side of the stripline given the orientation of the multi-layer cross connect in this application.) The detrimental effect of fringing capacitance depends on the relative amount of parallel plate capacitance in the stripline. Parallel plate capacitance is a function of area of the stripline adjacent the ground plane, which, in the orientation given in this application, is the area above and below the stripline. Increasing the width of the striplines increases the parallel plate capacitance. Therefore, if the height of the stripline remains the same but the width increases, the proportion of parallel plate capacitance to fringing capacitance will increase. Increasing this proportion generally increases the isolation between striplines. Accordingly, in a preferred embodiment, the width $w_0$ of the stripline 105 increases to $w_1$ before reaching the combiner 107 or transition vias 106 by a factor of greater than 1, more preferably, by a factor no less than about 1.5, and, even more preferably, by a factor no less than about 2. For example, if the width $w_0$ of the microstrip immediately adjacent the microstrip launch is 12.8 mils, then it increases preferably to 23.8 mils, more preferably to about, and even more preferably to about 34.4 mils at $w_1$ before reaching the combiner or transition vias 106.

As is well known in the art, increasing the width of striplines 105 generally reduces the relative inductance per unit length. Aside from the isolation advantages this offers as discussed above, this also results in a stripline having lower loss and higher efficiency/reduced insertion loss. Combining signals at lower impedances is also more realizable in Arlon CLTE because of manufacturing limits on the minimum resistor size as discussed below.

In addition to improving isolation by reducing the proportion of fringing capacitance, wider striplines 105 also facilitate the use of larger diameter transition vias 106. It has been found that wider transition vias 106 are less inductive, especially if the diameter of the transition via is greater than its height. Preferably, the ratio of the transition via's diameter to its height between ground planes 304, 305, 306 is greater than about 1, more preferably greater than about 1.5, and, even more preferably, greater than about 2. Furthermore, since the transition via is wider, it contains more conductive material and is therefore a more efficient coupler of energy between striplines on different layers.

The spacing of the transition vias can also improve performance. Referring to FIG. 1, a signal is transmitted from the bottom layer 101 of the multi-layer cross connect 100 to a third layer 410 (see FIG. 4) by way of a series of transition vias 121, 122 between ground planes 305 & 306 and 306 & 307, respectively. It has been found that spacing these transition vias apart by an interval of a ¼ wavelength of the expected operating frequency results in phase cancellation of reflected signals and, hence, improved reflective loss. In fact, it has been observed that, due to this phase cancellation, isolation on channels on the third layer 410 (FIG. 4) is better than that on the second layer which only comprises one transition via. In light of this fact, to exploit phase cancellation and to improve reflective loss, it is within the scope of the invention that signals may be transmitted circuitously to the second layer 409 by means of a series of transition vias which transmit signals from the first layer 408 to the second layer 409, and then to the third layer 410, and then back down to the second layer 409.

Another geometrical relationship of the multi-layer cross connect, which contributes to high isolation, is the layout of the striplines 105. Specifically, between the microstrip launches 104 and combiner 107, the striplines 105 are curved such that adjacent striplines 115, 116 are not parallel and are constantly vary in separation along their length. Curving lines minimize coupling to adjacent lines because they are relatively close together for only short distances.

Yet another geometrical feature of the multi-layer cross connect and the switch matrix of the present invention is the isolation ground gaps between the microstrip launches 104 of the multi-layer cross connect 100 and the microstrip strips 203 of the switch matrix 200. Specifically, in a preferred embodiment, all microwave power travels in to and out of the multi-layer cross connect through microstrip launches 104 which are located on the first or bottom layer 101 of the multi-layer cross connect 100, which is disposed directly on the channel floor 202. The RF line currents and ground currents must be restricted so as not to couple energy to adjacent launches or layers. This means that the only a direct shielded microstrip ground connection can be made into the multi-layer cross connect 100. Although some kind of continuous isolation wall or ground around the microstrips 203 and launches 104 would restrict microstrip ground currents to the adjacent channel floor 202 beneath the microstrip 203, such a configuration is not practical. Mechanical tolerances require a ground gap Δ between the ground gap interface 107 and the wall 208 around the launches 104 to facilitate the installation of the multi-layer cross connect 100 in the switch matrix 200. Although some tolerance is required to facilitate assembly, the gap should be small enough to attenuate RF radiation just as small holes in the metal door of a microwave oven prevent microwave radiation from escaping. Specifically, it has been found that by limiting Δ to significantly less than the wavelength of the highest operating frequency of the switch matrix, emissions at this gap can be minimized if not eliminated. Δ is just a fraction of the wavelength of the highest operating frequency, preferably less than 1/10, and, even more preferably less than 1/20. For example, if the operating frequency is 10 GHz, which corresponds to a wavelength of 1.2 inches, the gap should be preferably no larger than 120 mils, more preferably no larger than 60 mils. In the embodiment disclosed herein Δ is 9 mils.

Shielding Features

In addition to geometric relationships, the present invention comprises preferably a number of shielding features that eliminate the formation or prevent the propagation of errant RF modes. These shielding features are present in both the multi-layer cross connect and the switch matrix package.

With respect to the multi-layer cross connect 100, one such shielding feature is the isolation vias disposed about the striplines 105 and the transition vias 106. It has been found that the combination of large diameter vias 114, 117 (FIG. 1) and the relatively small distance between ground plane layers 304, 305, 306, 307 (FIG. 3) renders the use of isolation vias effective in eliminating the propagation of errant RF modes between adjacent striplines 115, 116 (FIG. 1). Like the transition vias, preferably, the ratio of the isolation vias' diameter to their height between ground planes 304, 305, 306 is greater than about 1.5, and, more preferably, greater than about 2. Preferably the isolation vias, such as isolation via 114, are as large as possible within the confines of adjacent striplines 115, 116. Where space is limited, it is preferable to use a number of densely-packed smaller isolation vias 117. It is also preferable to circumscribe a transition via 106 with a number of smaller isolation vias 118.

Referring to FIG. 3, another shielding feature of the multi-layer cross connect 100 is the presence of ground planes 304, 305, and 306 interleaved between the first (or bottom), second, and third circuit board layers 301, 302, 303. The large ground planes 304, 305, 306 shield the layer-to-layer transitions vias 106 and provide continuous non-radiating ground currents between the layers. This allows an entire layer to be shielded even though there are a number of transition vias to the other layers passing through it. Preferably, the ground planes are spaced at a distance which minimizes or eliminates the possibility of wave propagation in the circuit board. It has been found that by minimizing the distance between ground planes, propagation of errant RF modes between layers can be eliminated. It is well known that shorter wavelengths require less distance between ground planes to support wave propagation. Accordingly, in a preferred embodiment, the distance between ground planes around 1/20 of the wavelength of the highest operating frequency for which the switch matrix is designed, more preferably, no greater than 1/10 of the wavelength, and, even more preferably, no greater than 1/8 of the wavelength. For example, if the switch matrix is intended to operate at a frequency of 10 GHz, which corresponds to a wavelength of 1.2 inches, the maximum spacing between ground planes is about 40 to 50 mils.

Figure 4:
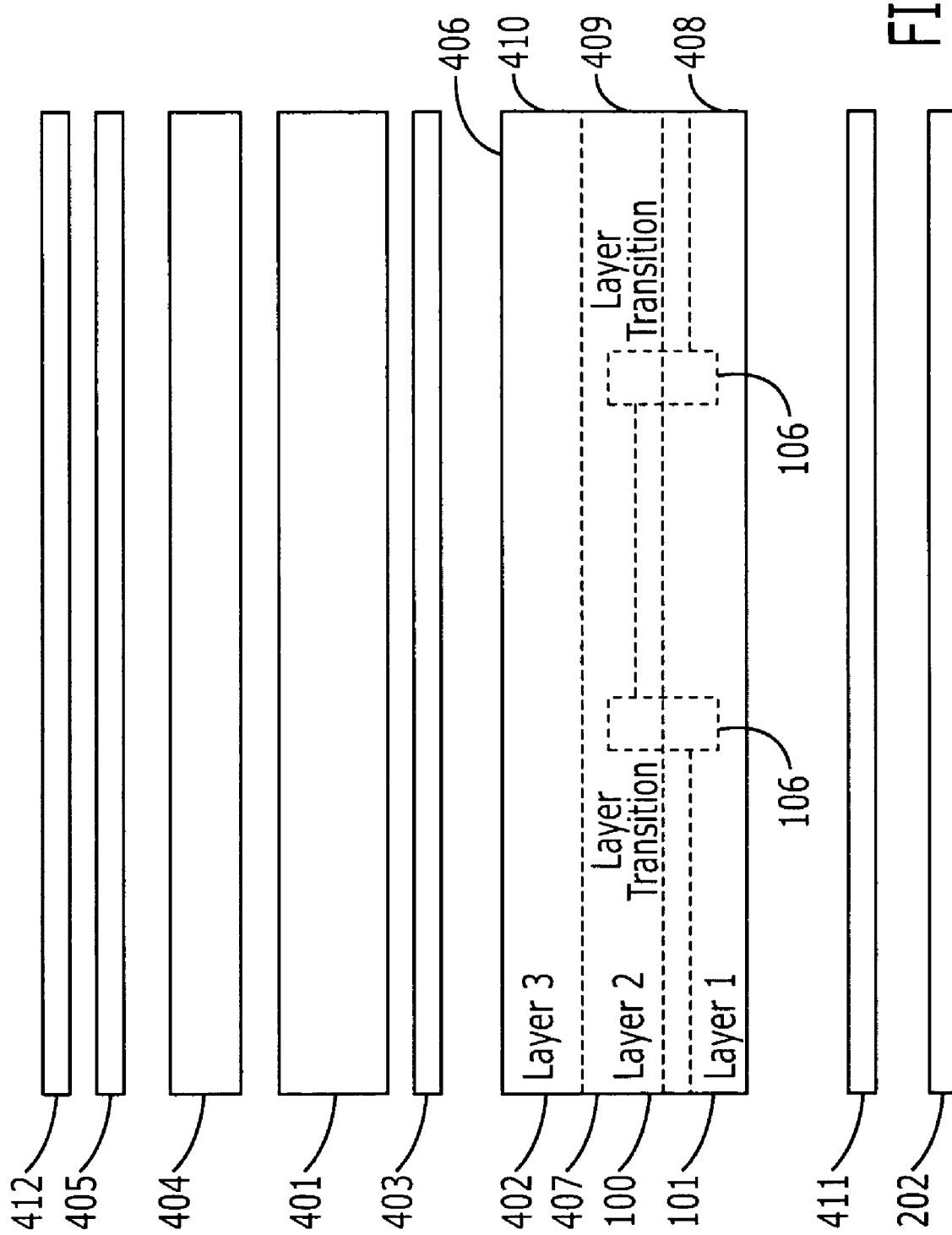
FIG. 4 shows a schematic view of the installation of the multi-layer cross connect in the switch matrix of FIG. 2.

Referring to FIG. 4, another shielding feature of the switch matrix of the present invention is shown—that is, one or more conductive gaskets 401 above the top surface 406 of the multi-layer cross connect 100. Specifically, the gasket serves to "capture" any stray emissions emanating from the microstrip launches and channel them to ground before they couple to other launches. Although the use of gaskets in switch matrixes is not particularly novel, the applicants have, in the present application, developed a more effective gasketing approach by using shims 403, 404, 405 to obtain more uniform compression of the gasket 401 across the top surface 406 of the multi-layer cross connect 100. Specifically, applicants have developed a technique in which the topography of the top surface 406 is determined, and then a number of shims are combined to compensate for the greatest topographical difference in the top surface 406. Applicants have found that by compressing the conductive gasket but not overly compressing it to the point where the limits of its compressibility are met, significant improvement in isolation between the striplines can be achieved. Generally, it is preferred that the gasket not be compressed more than 20% of its thickness and, more preferably no more than 15% and even more preferably no more than 10% of it thickness.

By using a combination of these geometrical and shielding features, the multi-layer cross connect and switch matrix of the present invention offer unparalleled isolation. One aspect of the invention is a multi-layer cross connect in which the isolation between layers is preferably at least 80 dB, and more preferably 85 dB for a non-amplified path in the 20 GHz range, and a switch matrix in which the layer-to-layer isolation is at least 70 dB and preferably 75 dB for a non-amplified paths in the 20 GHz range. Corresponding paths of each layer track within about 1 dB, and more preferably within about 0.5 dB. The switch matrix preferably has a total insertion loss for a non-amplified path of no more than 19 dB and preferably less than 17 dB, while the reflective loss of the multi-layer cross connect is preferably no less than 10 dB, and more preferably no less than 15 dB.

Referring to FIG. 1, the preferred multi-layer cross connect 100 is considered in greater detail. This particular multi-layer cross connect 100 comprises a three layer circuit board 407 as shown schematically in FIG. 4, however, the invention is not limited by the number of layers. The three layers 408, 409, 410 (or more) using this board topology effectively occupy the same area as one conventional planar circuit, thereby facilitating miniaturization. Referring to FIG. 1, the combiner 107 is configured to combine the RF signals from six different "input" striplines 105d on each layer and combine them on to a common "output" stripline 105e on each layer. Specifically, just before the microstrip in the microstrip launch 104 enters the edge boundary 119 of the stripline region of the layer, the microstrip tapers down at an optimized distance and rate to minimize microwave reflections. It enters this solid dielectric stripline region as a 50 ohm stripline and is transformed down to 25 ohms immediately through a four-section, stepped line width Chebychev transformer 130 designed with non-reflecting curvature. The curving lines minimize coupling to near by lines because they are close together for only short distances. In this particular embodiment, a third of these 25 ohm striplines (i.e., striplines 105a) stay on the bottom layer and the other two thirds (i.e., striplines 105b) of the 25 ohm lines transition up to the two upper layers along transition vias 106. Specifically, striplines 105f transition up to striplines 105c on the first upper layer or second layer 409 (see FIG. 4) through transition vias 120, and striplines 105g transition up to striplines 105c on the second layer 409 through transition vias 121 and then up to striplines 105c on the second upper or third layer 410 through transition vias 122. Return loss is improved in this configuration by spacing the transitions vias 121 and 122 apart at ¼ wavelength intervals to phase cancel reflection. Preferably, the transition vias are through hole vias, thereby avoiding buried or internal vias which keeps manufacturing costs down. The combination of small vias along the transmission lines and large vias across ground planes suppresses all other propagating parallel plate waveguide modes within the layers which results in excellent isolation.

All 25 ohm lines end up connecting to the 6-way power combiners on each layer. Preferably, the layout of each layer places almost all the combiners on top of each other so it is easier to place continuous via walls through all layers around each of these combiners. The combiner in this embodiment is a 5–20 GHz six-way combiner with Thin Film Ohmega ply resistors. The resistors in a 25 ohm power combiner are wider and more easily etched as discussed below. This 6-way combiner uses five 2-way combiners 107 and divides power into four 9 dB ports along with two 6 dB ports. The 9 db path goes through 3 2way combiners and 6 dB path goes through 2 2way combiners The ports are all equalized to 9 dB by adding 3 dB attenuators 820, 821 (FIG. 5) external to the board at the corresponding 6 dB port connections. At the inputs 110a, 110b to the final combiner 108 going to each sum port 109 is a 90 degree phase shift line length added which allows cancellation of reflections from these inputs at the final summing junction (i.e., final combiner 108). It is also interesting to note that the individual 2-way combiners 107 could be easily redesigned into 3-way combiners with three 75 to 50 ohm transformers at a summing junction (i.e., final combiner 108) in this 25 ohm system.

Once the signals are combined on one or more output striplines, they are coupled to an output port. Referring to FIG. 1, the signals are combined on to output striplines 105e1, 105e2, and 105e3 on the bottom layer 408, second layer 409 and third layer 410, respectively. The signals on the stripline 105e2 are coupled from the second layer 409 to the bottom layer 408 via output transition via 123, while signals on the stripline 105e3 are coupled from the third layer 410 to the second layer 409 and then from the second layer to the bottom layer 408 via output transition vias 124 and 125, respectively.

Although the three layer six-way combiner is described here in detail, it should be understood that the invention is not limited by the configuration of the combiner, and the number of inputs and outputs can be adjusted to suit the requirements of the application. Furthermore, for illustrative purposes, the invention is described herein by reference to a combiner which combines signals. A combiner, however, is not limited to this function and may act as a splitter, splitting signals from a common "input" stripline to various "output" striplines. Whether the combiner functions as a combiner or splitter is simply a matter of the direction of propagation of the RF signal.

Figure 5:
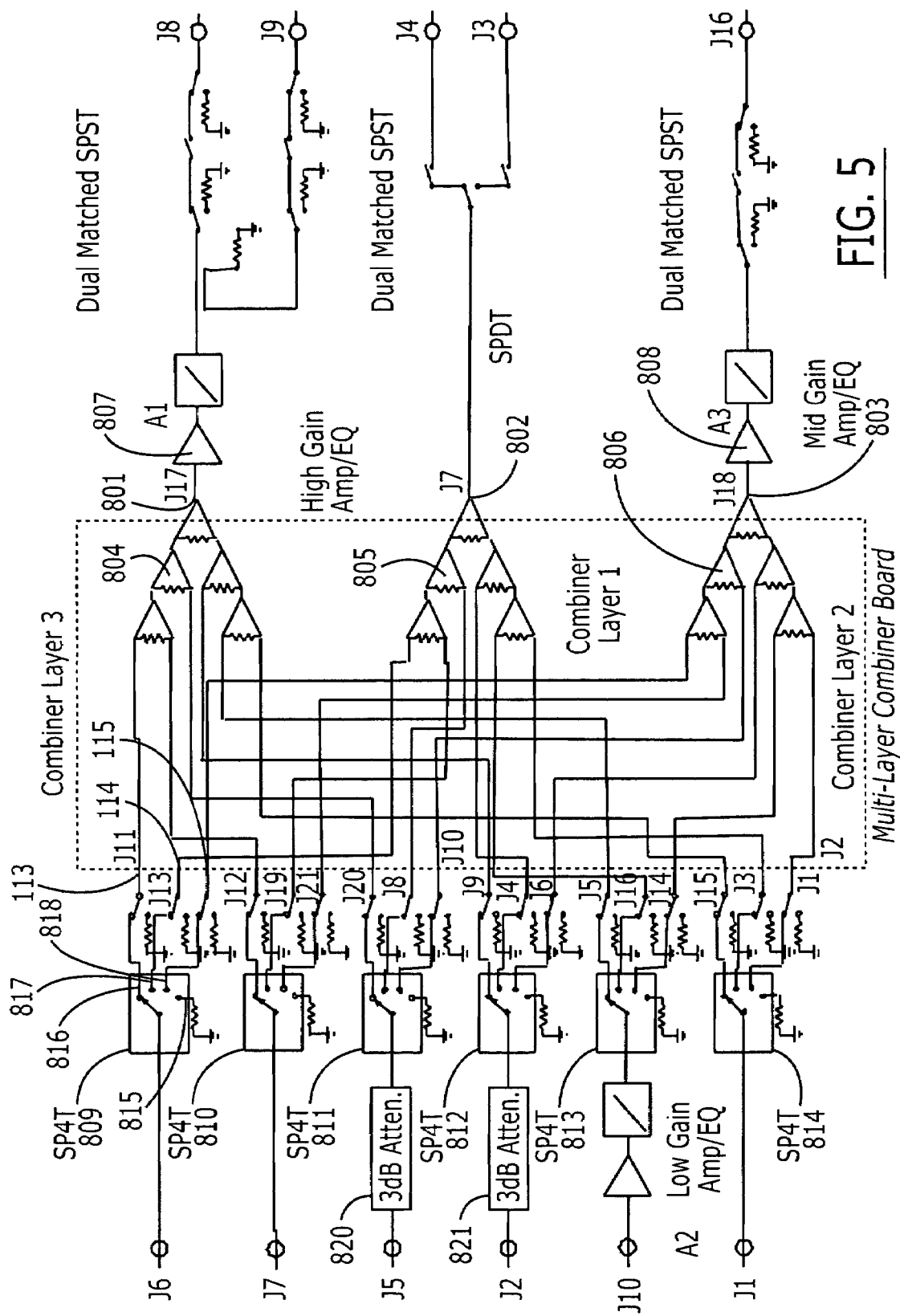
FIG. 5 shows an electrical schematic diagram of the switch matrix of FIG. 2.

Referring to FIG. 5, a schematic of the circuitry 800 of the switch matrix is shown. The multi-Layer cross connect 100 was designed for the switch matrix and has three summing ports 801, 802, 803 from three different layers of six-way combiners 804, 805, 806 on layers 3, 1 and 2, respectively. Two of these summing ports 801, 803 go to amplifier chains 807, 808 which then lead to outputs J8, J9 and J16 through switching networks (see FIG. 2). The remaining summing port goes to outputs J3 and J4. Preferably, layer 2 and layer 3 go to amplifiers 807, 808 while layer 1 contains the combiner network going to the passive output.

The inputs to the multi-layer cross connect lead from SP4T switches 809–814, and one of these connections (e.g., 815 in switch 809) in is terminated in 50 ohms. The other three connections (e.g., 816, 817, and 818 in switch 809) go to combiner inputs on each of the three layers (e.g., 111, 112, and 113 for switch 809). Two sets of SP4T switches 811, 812 have 3 dB attenuators connected to them for equalizing the 6 dB combiner inputs with the 9 dB combiner inputs. Inputs J1, J2, J5 are J6 connect directly to outside SMA connectors and Input J10 is amplified.

Referring to FIGS. 1 and 3, an exemplary manufacture of the multi-layer cross connect is considered in detail for illustrative purposes, although it should be understood that other manufacturing approaches are well within the scope of the invention. There are six 10 mil thick sheets of Arlon CLTE 308–313, which make up the 3 layered cross connect. This dielectric material is a ceramic powder-filled and woven micro fiberglass composite with a nominal relative dielectric constant of 2.94. These six sheets are bonded together with 5 FEP films 314–318, which are two mils thick. Preferably, these are DuPont Teflon FEP (fluorinated ethylene propylene) films with a nominal relative dielectric constant of around 2.1.

The Arlon CLTE dielectric sheets 308–310 have the combiner circuitry etched on them. These contain the Ohmega-ply resistive films 301–303, respectively, which are etched into the power combiner circuitry. The resistive material used is nickel-phosphorus alloy with film thicknesses of about 0.05–0.4 microns, which corresponds to 250–25 ohms per square sheet resistivity. These resistive films 301–303 are manufactured and sold by Ohmega-Ply Technologies to Arlon Corporation, who laminates them to their dielectric materials. These films come in 25, 50, 100 and 250 ohms per square. The 50 ohms per square resistive film is what is being in this design. The value tolerances are +/−5% for all but the 250 ohm per square film, which has a +/−10% tolerance.

The resistive films 301–303 are plated with a thin layer of copper on one side and the other side is laminated to the dielectric. The exposed copper on top is then electroplated. The electrodeposited copper is usually ½ oz or 1 oz thickness with ½ oz copper being used in this design.

In this embodiment, there are three etching steps used to form these circuits, whereas a copper only circuit requires just one etching step. These three steps are: (1) etching copper down around the resistive film, (2) etching away the exposed resistive film, and (3) etching away just the copper covering the resistor film elements.

Preferably, all etched circuits on resistive films 301–303 are contained within the ground planes 304–307 except for the microstrip launches disposed on the first or bottom layer. The copper ground planes 304–307 between as well as above and below the etched combiner circuits are copper only. Between the layers, the ground planes 305, 306 have circular etched back areas to facilitate the passage of the plated layer transition via 106 (See FIG. 1). Each circuit is covered with a 2 mil FEP bonding film 314–318 and then a 10 mil sheet of Arlon CLTE dielectric 311, 312 without copper at this interface.

After all the ground planes and circuits have been etched, the components shown in FIG. 4 are stacked up and put under intense heat and pressure causing the FEP films to flow. When it cools, the FEP films solidify and all sheets become bonded together. Preferably, these boards are all done in large panel form so that many can be produced at once.

Before the boards are machined out, the isolation and transition vias holes are drilled and plated. All of these are through holes which are easier and less expensive to manufacture. The layer-to-layer transition vias, however, need to be machined again to disconnect them from the top and bottom ground planes 307, 304. This is done using a 60 mil end mil creating counter bores going about 5 to 15 mils into the board depending on the side and layer transition being machined. The ground planes in the middle 305, 306 should be etched back so they will not short to the layer transitions. After the machining is completed, the boards are cut from the panels. The 60 mil counter boards are then filled with RTV and the board is cured for a sufficient time, for example, 2 days. After curing, the excess RTV is trimmed flush with the ground planes 307, 304 and the multi-layer cross connect is completed and ready to be incorporated into the switch matrix.

Referring to FIG. 4, the installation of the multi-layer cross connect and the final assembly of the switch matrix is considered in detail. The installation of the multi-layer cross connect in the switch matrix requires that the boards are first cleaned to ensure that there are no contaminants. This will allow good adhesion of the silver epoxy.

The channel floor 202 has counter bores (not shown) which cover the layer transition openings at the bottom of the board and bosses (not shown) to align the board in place. A 3 mil silver epoxy sheet 411 has corresponding holes for the counter bores and bosses arising from the channel floor. The multi-layer cross connect 100 is placed in the cavity over the epoxy sheet 411 and aligned with a Duroid dielectric sheet and metal assembly fixtures to ensure the correct evenly distributed pressure spacing around the board. A pressure of 50 psi is applied at 160° C. for several hours to bond the multi-layer cross connect into the housing 201 (see FIG. 2). After cooling, the assembly fixtures are removed and the board is cleaned. The board epoxy installation process is now complete.

Figure 6:
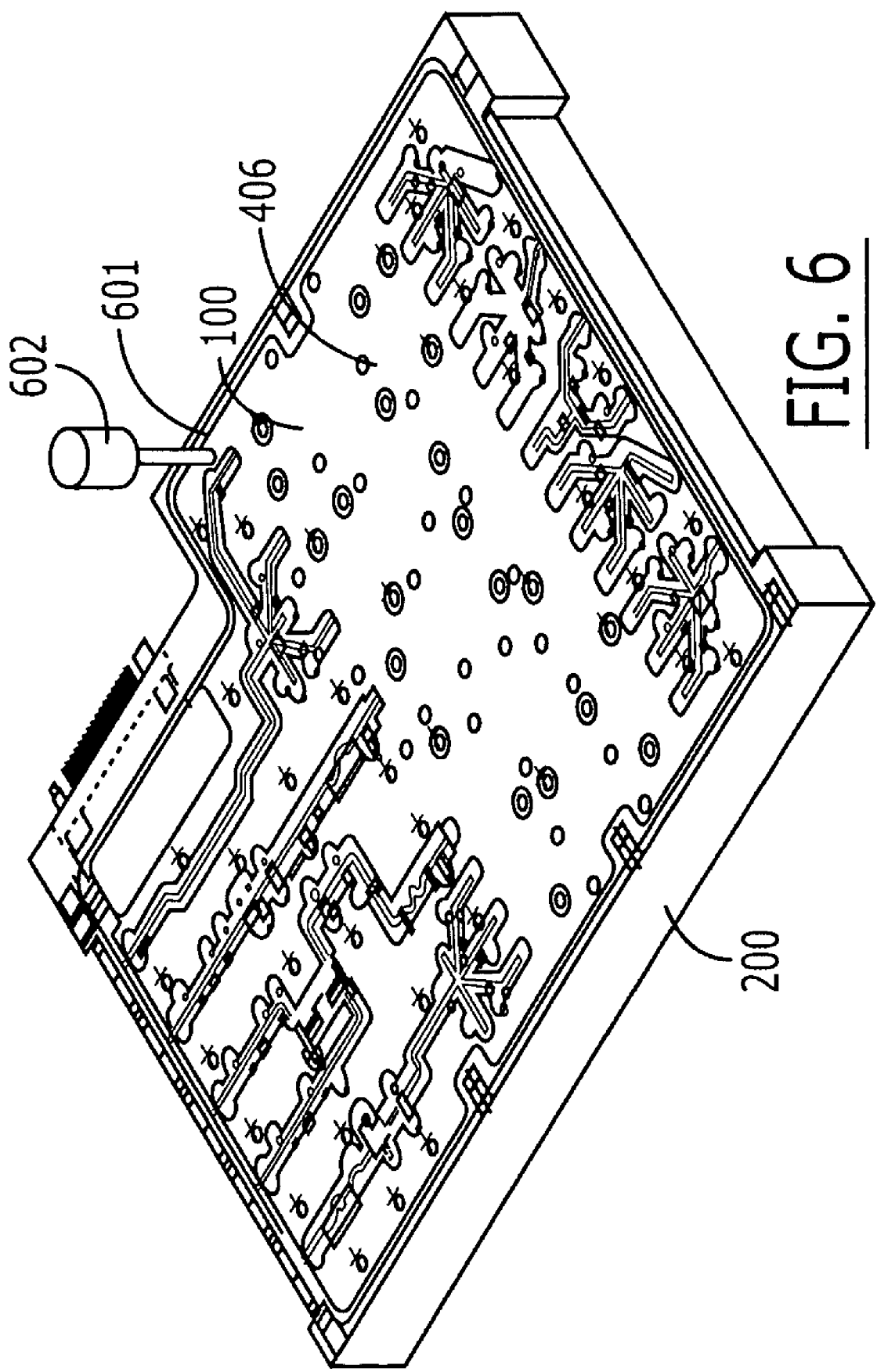
FIG. 6 shows the switch matrix of FIG. 2 in a partially assembled state undergoing a determination of the topography of its upper layer.
Figure 7:
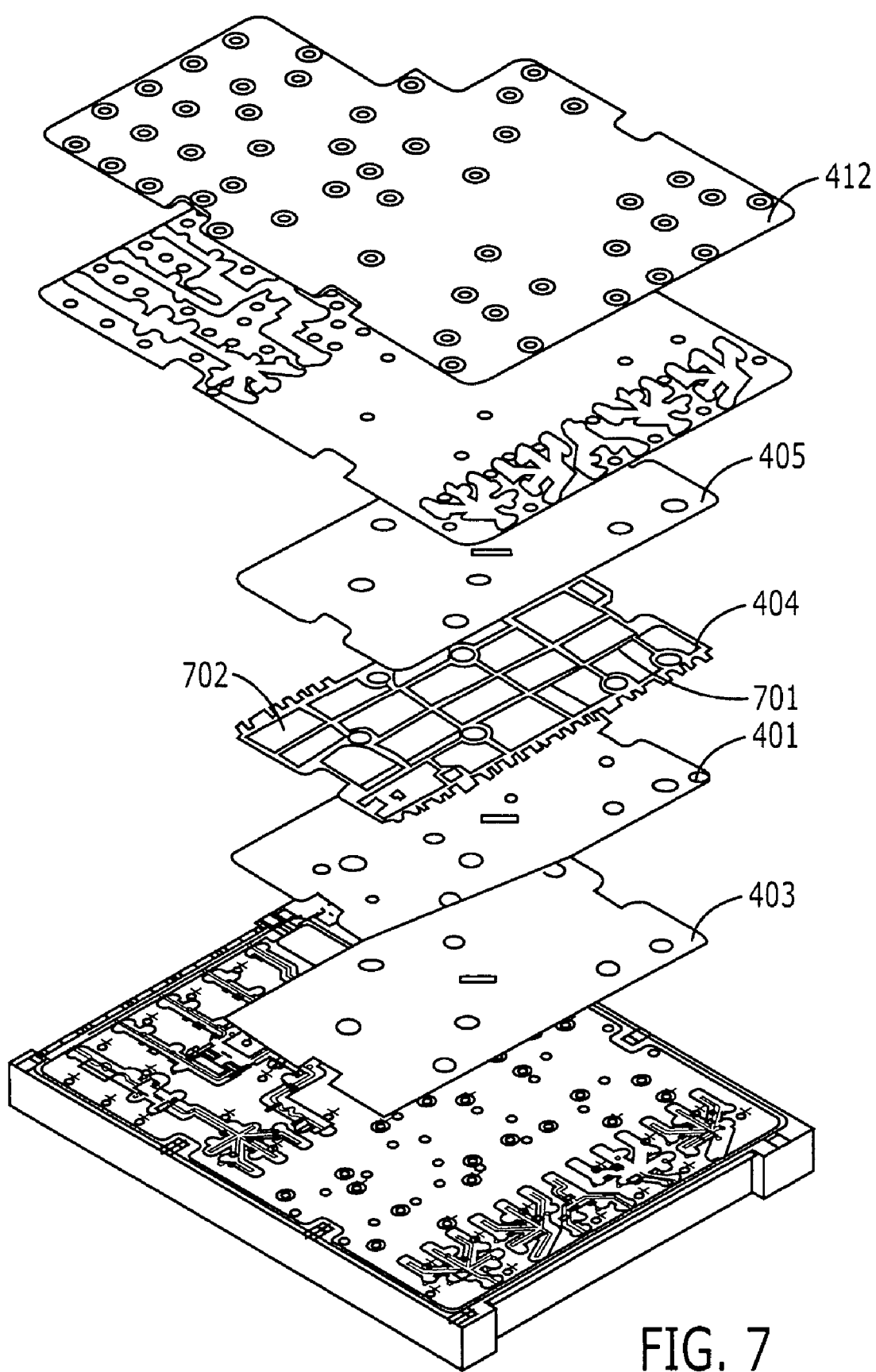
FIG. 7 shows an exploded view of a stack of shims and a gasket prepared in accordance with the topography of the top layer.

Referring to FIGS. 6 and 7, the sizing of the shims and conductive gasket on top of the board is considered in detail. The Chomerics gasket 401 shown in FIG. 7 is 20 mils thick and requires a 15 mil EDM shim 404 to apply pressure around it. This pressure is distributed to allow the gasket material to flow, thereby preventing this material from taking a permanent compression set and losing its flexibility. Specifically, the EDM shim 404 applies pressure to compress the gasket 401 only at key points 701, while leaving other windows 702 open such that the gasket material can flow freely. In this respect, it has been found that the gasket 401 can be compressed to a greater degree if the EDM shim 404 is configured with such windows to allow the gasket to flow. Soft copper or brass shims 403, 405 provide a high malleable high conductivity material to increase shielding at the immediate interfaces.

The gasket within this stackup cannot be over compressed. Accordingly, minimum compression is applied to lowest spots on the board to ensure compression so that the highest spot on the board will not compress too much. To this end, the following procedure is used to properly size the shims 403, 404, 405 for compressing the gasket. First, a gauge 602 is used to take a number of measurements of the distance from the RF inner cover plane down to the top 406 of the multi-layer board in a number of places 601, and the largest value is determined. This is the total thickness of shims that need to be used in the stack-up shown in FIG. 7. From this total the thickness of the Chomerics shim 401 and EDM shim 404 are subtracted to arrive at the total thickness of brass or copper shims needed to complete the final stack-up.

The gasket 401 and selected shims 403–405 is next placed on top 406 of the multi-layer cross connect and the cover 412 secured. Once this has been accomplished the board installation process is complete.

EXAMPLE

Figure 10:
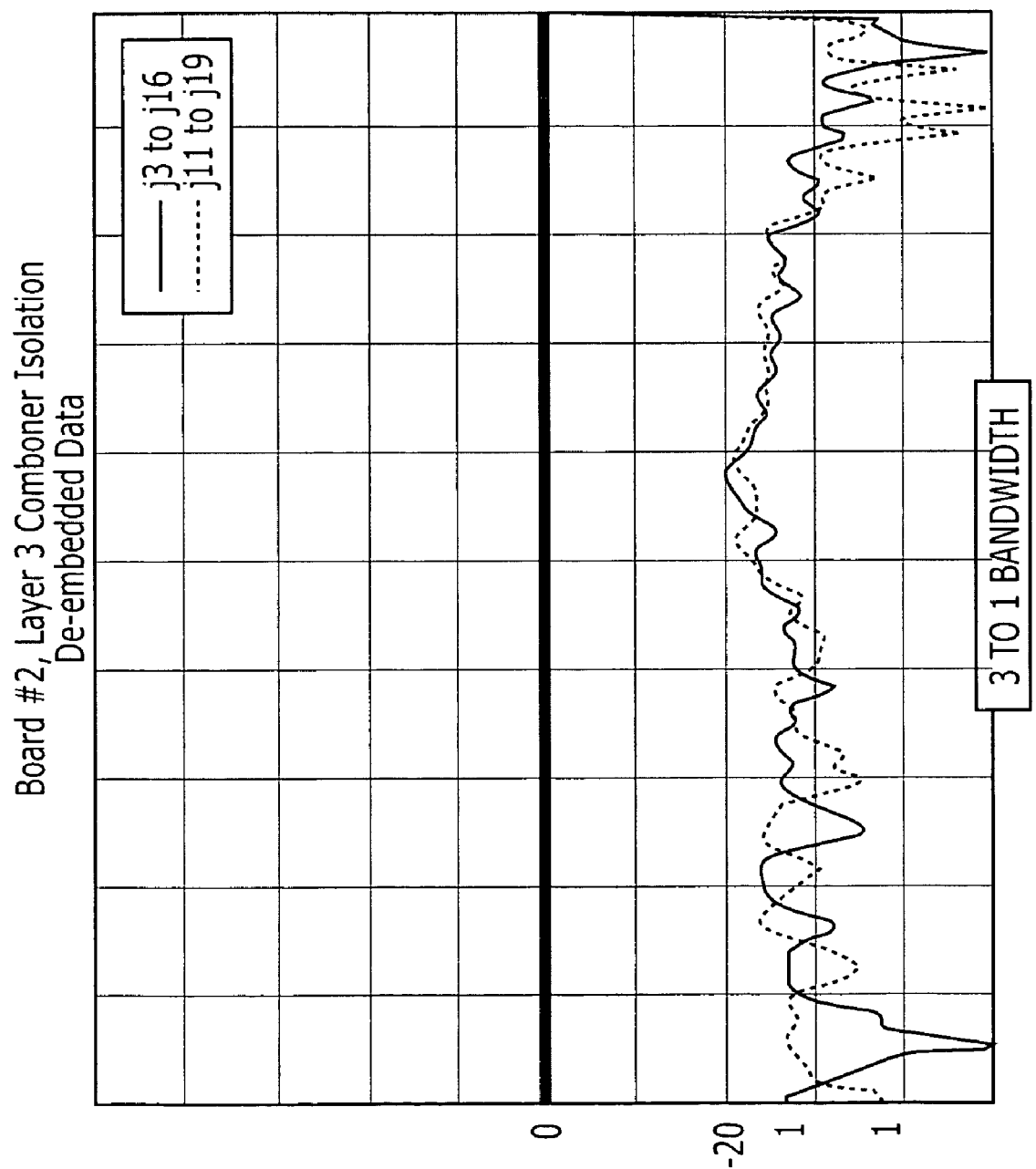
FIG. 10 shows the combiner isolation measurements.
Figure 11:
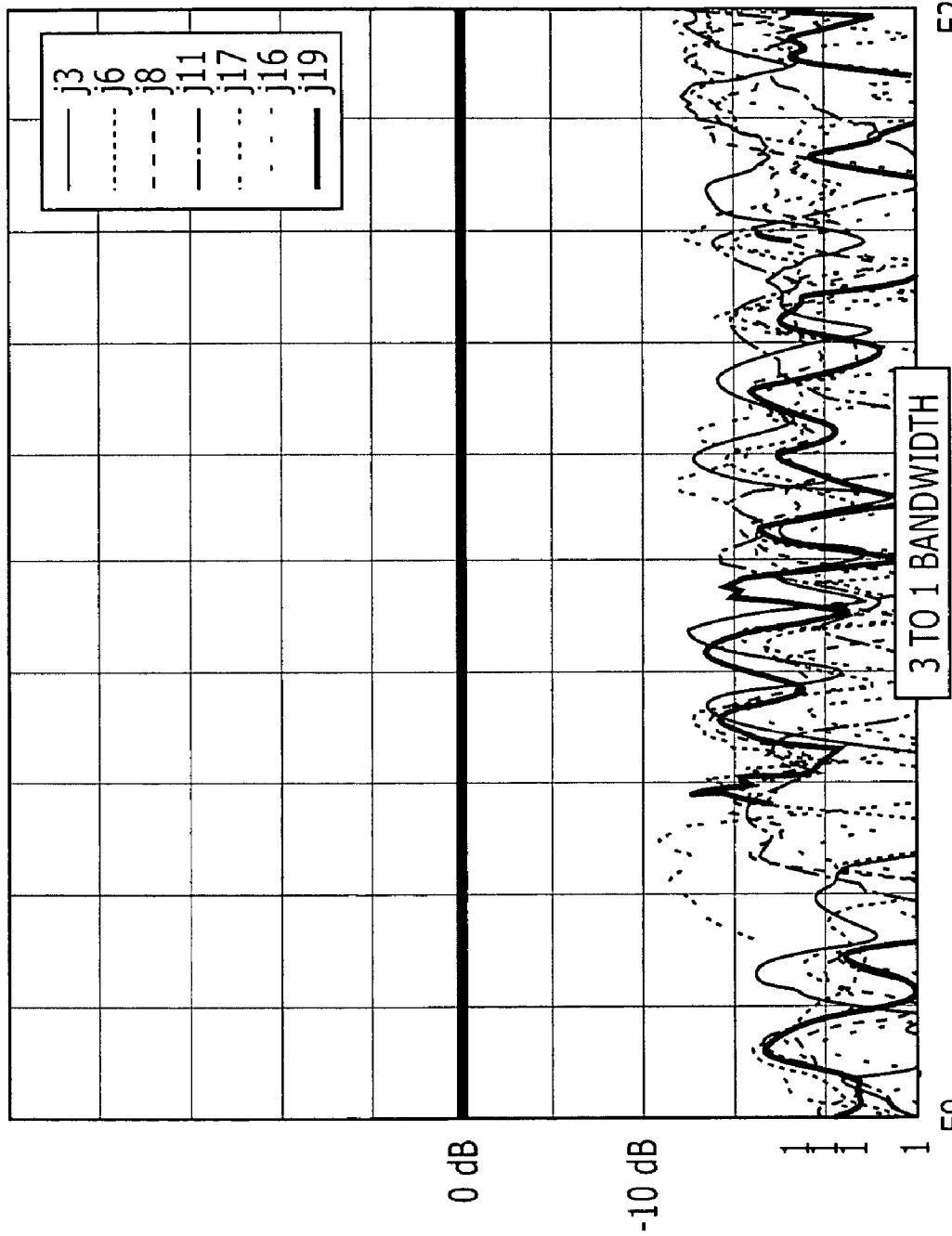
FIG. 11 shows the isolation data for layer-to-layer isolation.

A switch matrix having the configuration depicted in FIG. 2 was tested for a 3:1 bandwidth to determine Insertion Loss (FIG. 8), Return Loss (FIG. 9), Combiner Isolation (FIG. 10) and Layer-to-layer Isolation (FIG. 11). All four measurements involve a three layer multi-layer cross connect, in which the third layer has two layer transitions associated with every input and output.

Figure 8:
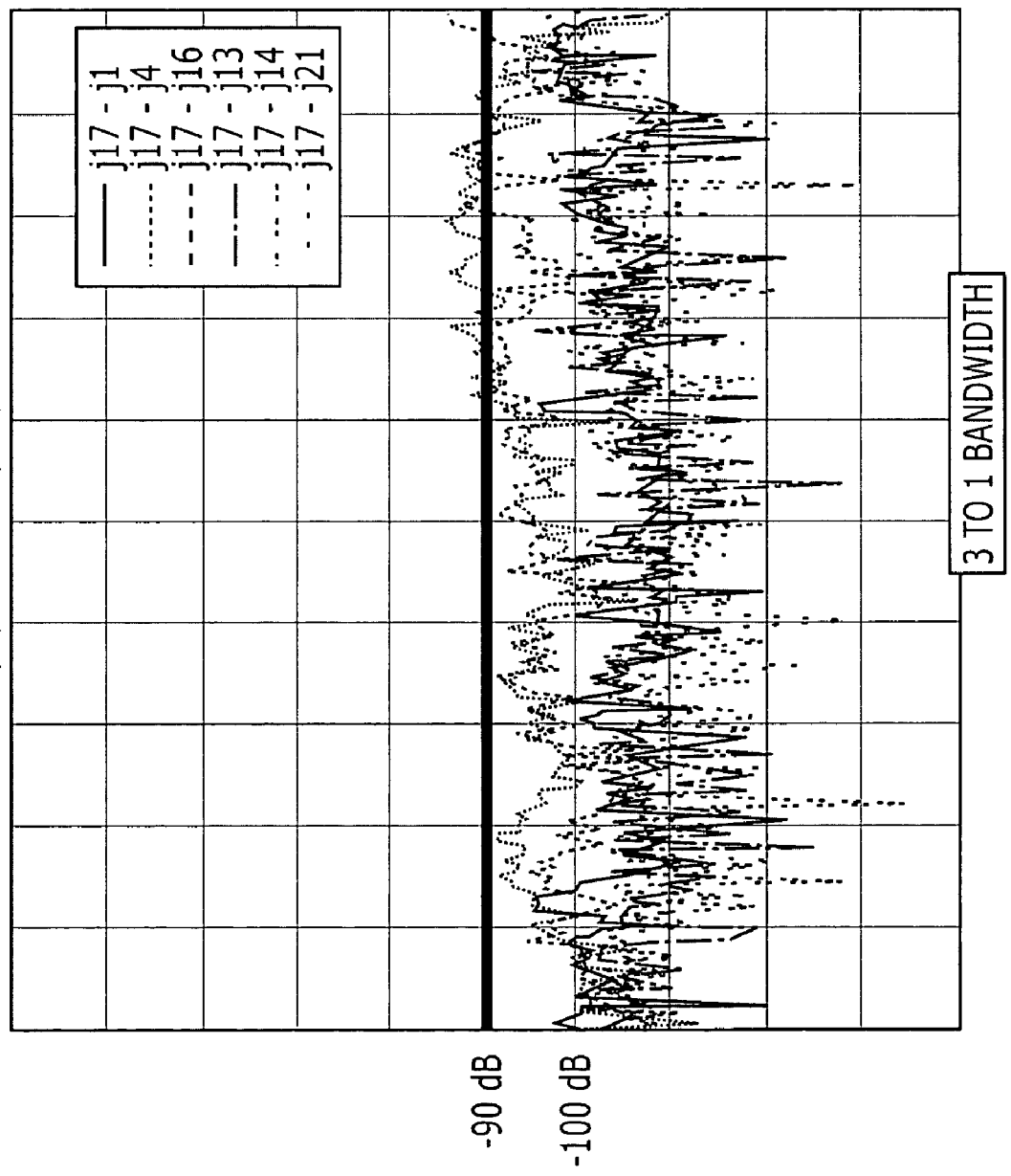
FIG. 8 depicts insertion loss data for the 6 dB and 9 dB combiner paths of the multi-layer cross connect of FIG. 1.

The Insertion Loss data in FIG. 8 shows 6 dB and 9 dB combiner paths 132, 131, respectively, respectively. Near the low end of the 3:1 bandwidth, the insertion loss approaches the 6 and 9 dB combiner loss limits. At the upper end of the 3:1 bandwidth, the combiner loss is about 3 to 4 dB above the combiner loss. The tracking is within 1 dB and the ripple is within +/−0.5 dB. The insertion losses are less for the other layers because fewer layer-to-layer transitions are needed. The numbering of the ports only refers to the Multi-layer board connections and uses j17 as the sum port, all others are the combiner input ports.

Figure 9:
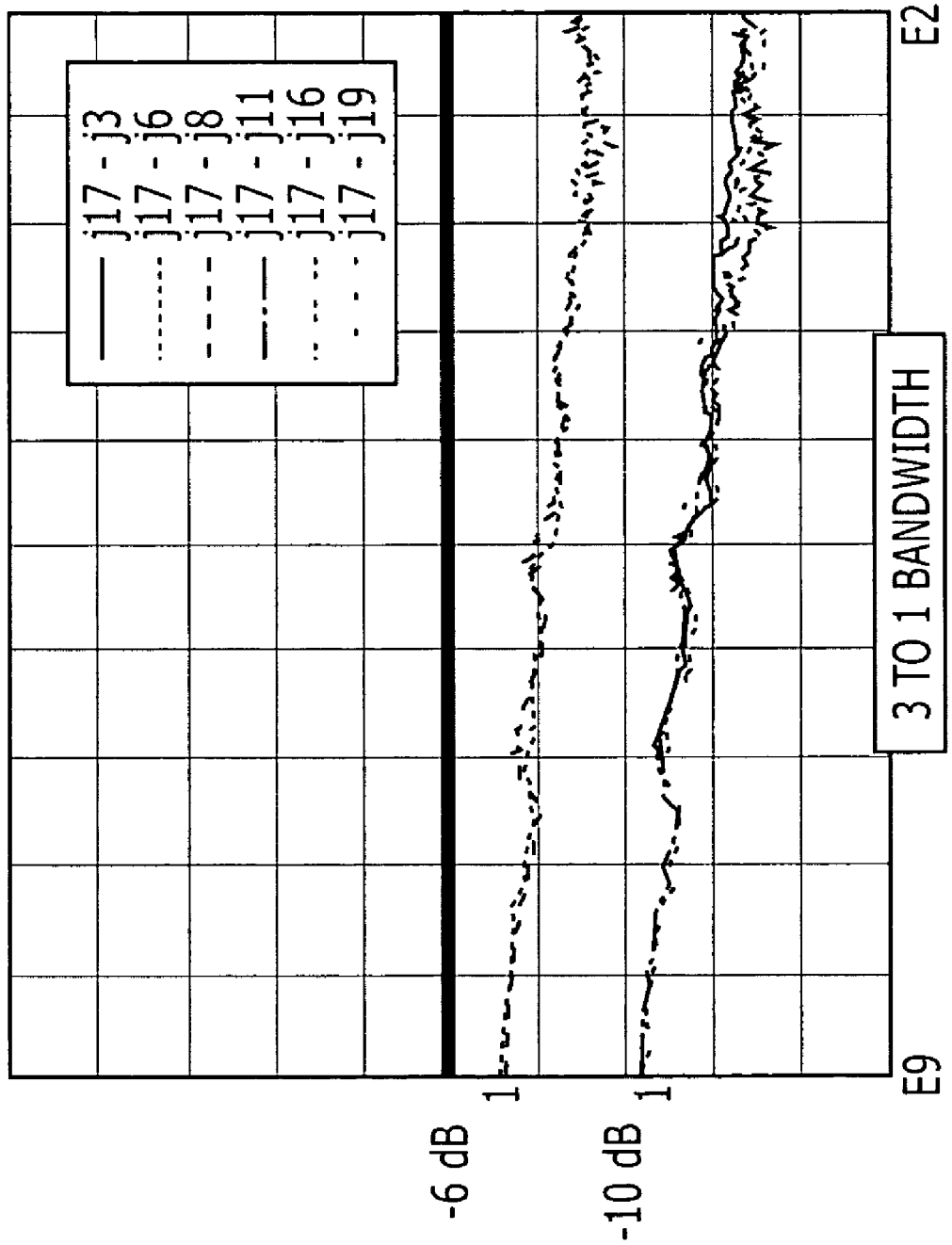
FIG. 9 shows the return loss for the same corresponding ports going to layer three.

FIG. 9 shows the Return Loss for the same corresponding ports going to Layer 3. The sum port Return Loss at j17 is the lowest because there is no combiner isolation between this and all the other ports, which allows all the reflections to add up unattenuated from all the other ports. The sum port return loss 11 dB worst case and the combiner input ports are around 13 dB worst case. Generally, the combiner input ports are around 15 dB return loss.

Combiner isolation measurements are shown in FIG. 10. These are the input ports going to the adjacent arms of the combiner. There are resistors which provide most of the isolation between the lines from these ports along with the insertion loss to the inputs on the Multi-Layer board which adds a little more. Generally, the isolation is 21 dB or better.

The Isolation data shown in FIG. 14 demonstrates a layer-to-layer isolation of more than 85 dB. Improvements to this isolation have since been made to reduce isolation leakage around the cc even further. The use of lower line impedances, larger transition vias and keeping lines from being too close together over large distances has given this design excellent isolation results.

What is claimed is:

1. A multi-layer cross connect having high isolation between signal channels, said multi-layer cross connect comprising:
   a multi-layer circuit board having a top and bottom orientation and comprising at least a bottom circuit board and two or more upper circuit boards;
   a plurality of microstrip launches along the perimeter of said bottom circuit board;
   a plurality of striplines on said bottom circuit board, each stripline being connected to one and only one microstrip launch and comprising a transformer for increasing the width of its respective stripline to lower its impedance;
   a plurality of transition vias, each transition via conductively coupling at least a portion of said striplines to one or more upper striplines on one or more upper circuit boards; and
   a combiner on each circuit board for combining signals from multiple striplines on a common circuit board to a common stripline.

2. The multi-layer cross connect of claim 1, wherein said stripline increases in width by a factor of no less than about 1.5.

3. The multi-layer cross connect of claim 1, wherein said striplines are curved.

4. The multi-layer cross connect of claim 1, further comprising ground planes between each circuit board.

5. The multi-layer cross connect of claim 1, wherein said transition vias have a diameter to height ratio between ground planes of no less than 1.5.

6. The multi-layer cross connect of claim 4, wherein the distance between ground planes is about $1/20$ the wavelength of the highest operating frequency.

7. The multi-layer cross connect of claim 1, further comprising isolation vias between adjacent striplines.

8. The multi-layer cross connect of claim 1, further comprising isolation via around said transition vias.

9. The multi-layer cross connect of claim 1, wherein the circuit board to circuit board isolation is at least 80 dB.

10. The cross connect of claim 1, further comprising one or more second vias for coupling one or more common striplines on one or more upper circuit boards to output microstrip launches on said bottom circuit board.

11. The multi-layer cross connect of claim 10, wherein all input and output microstrip launches are disposed on said bottom circuit board.

12. A switch matrix comprising:
   a housing having a channel floor;
   a plurality of micro strips on said channel floor, a portion of which are input microstrips and the remaining portion are output microstrips;
   a switch on each input microstrip;
   a cavity on said channel floor for receiving said multi-layer cross connect;
   a ground gap interface on each microstrip adjacent said cavity for interfacing with a microstrip launch of a multi-layer cross connect;
   a multi-layer cross connect disposed in said a cavity and comprising at least:
      a multi-layer circuit board having a top and bottom orientation and comprising at least a bottom layer and one or more upper layers;
      a plurality of first microstrip launches along the perimeter of said bottom layer, each microstrip launch interfacing with said interface of each micro strip;
      a plurality of striplines on said bottom layer, each stripline being connected to one and only one first microstrip launch and comprising a transformer for lowering its impedance and thereby increasing its width relative to the width of said micro strip launch, said striplines comprising first striplines and second striplines;
      a plurality of transition vias, each transition via conductively coupling each of said second striplines to a stripline on an upper layer; and
      a combiner on each layer for combining for combining signals from multiple striplines to a common stripline.

13. The switch matrix of claim 12, further comprising a conductive, compressible gasket which is compressed by no greater than 20% of its thickness.

14. The switch matrix of claim 12, wherein a gap exists between said ground gap interface and said microstrip launches, said gap being less than $1/20$ of the operating frequency of the switch matrix.

15. The switch matrix of claim 12, wherein said gap is less than 9 mil.

16. A switch matrix comprising:
   a housing having a channel floor;
   a plurality of microstrips on the channel floor; and
   a multi-layer circuit board having a top and bottom orientation disposed in said housing such that it resides on just one side of the channel floor, and comprising at least:
      a bottom circuit board and one or more upper circuit boards:
      a plurality of microstrip launches along the perimeter of said bottom circuit board electrically coupled to said microstrips.

17. The switch matrix of claim 16, further comprising ground planes between each circuit board.

18. The switch matrix of claim 16, wherein isolation between circuit boards for a non-amplified channel is at least 70 dB.

19. The switch matrix of claim 16, wherein said multi-layer cross connect comprises at least three circuit boards and the isolation between the first and third circuit boards for a non-amplified channel is at least 70 dB.

20. The switch matrix of claim 16, wherein said multi-layer cross connect comprises more than one upper circuit board.

* * * * *